(12) United States Patent
Tsuji (10) Patent No.: US 8,652,862 B2
(45) Date of Patent: Feb. 18, 2014

(54) METHOD FOR ETCHING INSULATING FILM AND METHOD FOR MANUFACTURING SEMICONDUCTOR OPTICAL DEVICE

(75) Inventor: Yukihiro Tsuji, Yokohama (JP)

(73) Assignee: Sumitomo Electronic Industries Ltd., Osaka (JP)

( * ) Notice: Subject to any disclaimer, the term of this patent is extended or adjusted under 35 U.S.C. 154(b) by 340 days.

(21) Appl. No.: 13/223,586

(22) Filed: Sep. 1, 2011

(65) Prior Publication Data
US 2012/0058582 A1    Mar. 8, 2012

(30) Foreign Application Priority Data
Sep. 6, 2010    (JP) .................................. 2010-199171

(51) Int. Cl.
*H01L 21/00*    (2006.01)
(52) U.S. Cl.
USPC .......... 438/32; 438/37; 438/614; 257/E33.069
(58) Field of Classification Search
USPC ........ 438/32–39, 172, 614, 637; 257/72, 408, 257/E21.002, E33.069; 216/52
See application file for complete search history.

(56) References Cited

U.S. PATENT DOCUMENTS

| | | | |
|---|---|---|---|
| 5,514,605 A * | 5/1996 | Asai et al. ..................... | 438/172 |
| 2007/0072405 A1 * | 3/2007 | Kainou et al. .................. | 438/614 |
| 2011/0199564 A1 * | 8/2011 | Moriwaki ..................... | 349/122 |

FOREIGN PATENT DOCUMENTS

JP    2000-323461    11/2000

OTHER PUBLICATIONS

M. Miller, et al., "Fabrication of nanometer sized features on non-flat substrates using a nano-imprint lithography process", Proc. SPIE 5751 994, 2005, pp. 995-998.

* cited by examiner

*Primary Examiner* — Mohsen Ahmadi
*Assistant Examiner* — Abdulfattah Mustapha
(74) *Attorney, Agent, or Firm* — Smith, Gambrell & Russell, LLP (57) ABSTRACT

A method for etching an insulating film includes the steps of forming an insulating film; forming a first resin layer composed of a non-silicon-containing resin on the insulating film; forming a pattern including projections and recesses in the first resin layer; forming a second resin layer composed of a silicon-containing resin to cover the projections and the recesses of the pattern in the first resin layer; etching the second resin layer by reactive ion etching with etching gas containing $CF_4$ gas and oxygen gas until the projections of the first resin layer are exposed, a Si component of the second resin layer being oxidized in etching the second resin layer; selectively etching the first resin layer until the insulating film is exposed using as a mask the second resin layer buried in the recesses of the first resin layer to form a resin layer mask; and etching the insulating film using the resin layer mask. Further, in the step of etching the second resin layer, the reactive ion etching is performed under applying a self-bias voltage so that a Si product is removed, the Si product being provided from the Si component remaining in the second resin layer without being oxidized.

11 Claims, 11 Drawing Sheets

METHOD FOR ETCHING INSULATING FILM AND METHOD FOR MANUFACTURING SEMICONDUCTOR OPTICAL DEVICE

BACKGROUND OF THE INVENTION

1. Field of the Invention

The present invention relates to a method for etching an insulating film and a method for manufacturing a semiconductor optical device.

2. Description of the Related Art

Japanese Unexamined Patent Application Publication No. 2000-323461 discloses one method for forming a fine pattern using a nano-imprint lithography (NIL) technique. In the method for forming a fine pattern using the NIL technique disclosed in this document, a mold having a predetermined pattern is pressed on resist applied on a substrate to transfer the predetermined pattern to the resist, forming a resist mask. Then, the substrate is processed using the patterned resist mask to form a fine pattern on the substrate.

Also, another method for forming a fine pattern using the NIL technique is described in M. Miller, et. al., "Fabrication of Nanometer Sized Features on Non-Flat Substrate Using a Nano-Imprint Lithography Process", Proc. SPIE 5751,994, pp. 995-998, (2005). This method includes a step of forming a resist mask using two resin layers. Specifically, a first resin layer is formed on a substrate, and a mold is pressed on the first resin layer to transfer projections and recesses to the first resin layer. Next, a second resin layer is formed to cover the first resin layer and then etched back to expose the projections of the first resin layer. Then, the exposed portions of the first resin layer are selectively etched up to the surface of the substrate using the second resin layer as a mask. As a result, a resist mask including the two resin layers is formed.

The NIL technique is preferably used for, for example, forming a diffraction grating structure in manufacturing a DFB (Distributed Feedback) laser diode. Furthermore, the diffraction grating structure including phase shift or a chirped diffraction grating structure can be fabricated by using the NIL technique. The diffraction grating structure includes periodic projections and recesses formed at a period of about 200 nm to 240 nm and having a depth of about 20 to 50 nm. In addition, the DFB laser diode is formed on a semiconductor substrate. As the semiconductor substrate, a compound semiconductor substrate such as an InP substrate is used. However, a surface of the compound semiconductor substrate is not completely flat and has some undulation (surface roughness) of about 0.1 μm (100 nm). When a pattern formed on the mold is transferred to a resin layer by pressing a mold on the resin layer, variation occurs in a pattern shape due to the surface roughness of the substrate. Specifically, variation occurs in the depth or line width of projections and recesses of the resin layer. When a semiconductor layer is processed using the resin layer as a mask, the pattern shape of the resin layer is directly transferred. Consequently, it is difficult to form a desired pattern in the semiconductor layer because of the variation in the pattern shape. Specifically, in forming a diffraction grating structure, when variation occurs in height of the projections and recesses of the resin layer, relatively thin regions of the projections in the pattern disappear. When a diffraction grating is formed on a substrate having some surface roughness thereof by using the NIL technique, it is difficult to form a desired diffraction grating pattern.

In this case, therefore, the resist pattern including two resin layers disclosed in the above-described document of M. Miller, et. al. can be used. First, a first resin layer is formed on a substrate, and then projections and recesses are formed by the NIL technique. Next, a second resin layer is completely buried in the recesses. In this case, the second resin layer is formed to cover the projections and recesses of the first resin layer. Then, the second resin layer is etched (etch-back step) until the projections of the first resin layer are exposed. As a result, there is no difference in level between the first resin layer and the second resin layer. A flat surface over the first resin layer and the second resin layer is obtained. Next, the first resin layer is selectively etched using the second resin layer as a mask to form projections and recesses (reverse pattern). Since the surface of the first resin layer is flat, the recesses and projections (reverse pattern) having a uniform shape can be formed. Therefore, a resist mask having a uniform shape with little variation regardless of the poor flatness of a substrate can be formed. Therefore, a diffraction grating structure can be preferably formed using the two-layer resist mask.

However, it was found that the use of such a two-layer resist for forming a diffraction grating structure has the following problem. That is, in order to sufficiently secure etching selectivity between the first resin layer and the second resin layer, a non-silicon (Si)-containing resin is used for the first resin layer, and a Si-containing resin is used for the second resin layer. However, it is generally difficult to uniformly etch the Si-containing resin layer in the etch-back step before selective etching. As a result, the projections of the first resin layer are not uniformly exposed, leaving the second resin layer as residues on portions of the surface. Therefore, a desired pattern cannot be obtained even by subsequent selective etching of the first resin layer.

SUMMARY OF THE INVENTION

A method for etching an insulating film according to the present invention includes the steps of forming an insulating film; forming a first resin layer composed of a non-silicon-containing resin on the insulating film; forming a pattern including projections and recesses in the first resin layer; forming a second resin layer composed of a silicon-containing resin to cover the projections and the recesses of the pattern in the first resin layer; etching the second resin layer by reactive ion etching with etching gas containing $CF_4$ gas and oxygen gas until the projections of the first resin layer are exposed, a Si component of the second resin layer being oxidized in etching the second resin layer; selectively etching the first resin layer until the insulating film is exposed using as a mask the second resin layer buried in the recesses of the first resin layer to form a resin layer mask; and etching the insulating film using the resin layer mask. Further, in the step of etching the second resin layer, the reactive ion etching is performed under applying a self-bias voltage so that a Si product is removed, the Si product being provided from the Si component remaining in the second resin layer without being oxidized.

In the method for etching an insulating film, the step of forming the pattern in the first resin layer may further include the steps of preparing a mold having the pattern; pressing the mold on the first resin layer, the pattern transferring to the first resin layer; curing the first resin layer while pressing the mold on the first resin layer; and detaching the mold from the first resin layer.

In the method for etching an insulating film, the insulating film may be composed of at least one of silicon oxide ($SiO_2$), silicon nitride (SiN), and silicon oxynitride (SiON). In addition, the non-silicon-containing resin may be composed of an acrylic UV curing resin, and the silicon-containing resin may be composed of an organic silicon compound.

Further, in the method for etching an insulating film, the reactive ion etching in the step of etching the second resin layer may be performed by using an ICP-RIE (inductive coupled plasma reactive ion etching) apparatus provided with an ICP output power supply and a bias output power supply so that the self-bias voltage is adjusted by high-frequency electric power supplied from the bias output power supply.

Further, in the method for etching an insulating film, in the step of etching the second resin layer, the self-bias voltage applied in the reactive ion etching for etching the second resin layer may be 130 V or more.

Further, in the method for etching an insulating film, in the step of etching the second resin layer, the ratio ($FL_{CF4}/FL_{O2}$) of the flow rate $FL_{CF4}$ of the $CF_4$ gas to the flow rate $FL_{O2}$ of the oxygen gas may be 5 or more and 10 or less.

In addition, in the method for etching an insulating film, after the step of etching the second resin layer, the maximum height $R_{max}$ of surface roughness of the second resin layer may be 6 nm or less.

In addition, in the method for etching an insulating film, after the step of selectively etching the first resin layer, the line edge roughness of the resin layer mask may be 10 nm or less.

A method for manufacturing a semiconductor optical device according to the present invention is a method for manufacturing a semiconductor optical device including a diffraction grating. The method includes the steps of growing a semiconductor layer; forming an insulating film on the semiconductor layer; forming a first resin layer composed of a non-silicon-containing resin on the insulating film; forming a pattern including projections and recesses in the first resin layer; forming a second resin layer composed of a silicon-containing resin to cover the projections and the recesses of the pattern in the first resin layer; etching the second resin layer by reactive ion etching with etching gas containing $CF_4$ gas and oxygen gas until the projections of the first resin layer are exposed, a Si component of the second resin layer being oxidized in etching the second resin layer; selectively etching the first resin layer until the insulating film is exposed using as a mask the second resin layer buried in the recesses of the first resin layer to form a resin layer mask; etching the insulating film using the resin layer mask; and etching the semiconductor layer using the insulating film as a mask to form the diffraction grating. Further, in the step of etching the second resin layer, the reactive ion etching is performed under applying a self-bias voltage so that a Si product is removed, the Si product being provided from the Si component remaining in the second resin layer without being oxidized.

In addition, in the method for manufacturing a semiconductor optical device, in the step of etching the second resin layer, the self-bias voltage applied in the reactive ion etching for etching the second resin layer is 130 V or more.

DESCRIPTION OF THE PREFERRED EMBODIMENTS

A method for etching an insulating film and a method for manufacturing a semiconductor optical device according to embodiments of the present invention are described in detail below with reference to the accompanying drawings. In the drawings, the same component is denoted by the same reference numeral, and repeated description is omitted.

Figure 1:
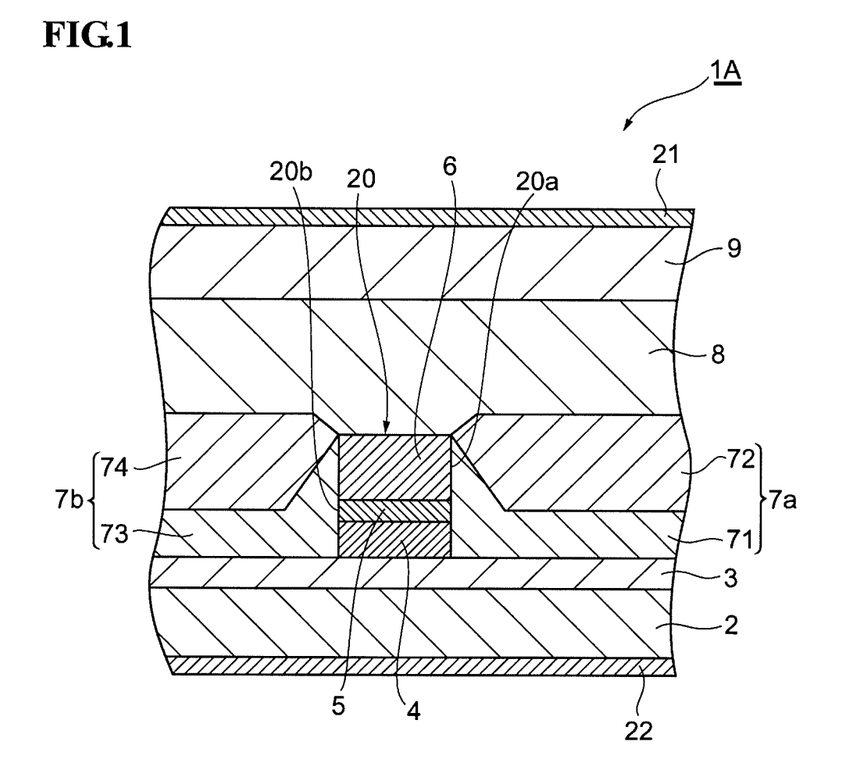
FIG. 1 is a sectional view showing a configuration of a semiconductor optical device manufactured by a method for manufacturing a semiconductor optical device according to an embodiment of the present invention.

FIG. 1 is a sectional view showing a configuration of a semiconductor optical device manufactured by a method for manufacturing a semiconductor optical device according to an embodiment of the present invention. FIG. 1 shows a DFB laser diode 1A as an example of a semiconductor optical device. The DFB laser diode 1A includes a semiconductor substrate 2, a lower cladding layer 3, a lower optical confinement layer 4, an active layer 5, a diffraction grating layer (upper optical confinement layer)6, buried regions 7a and 7b, an upper cladding layer 8, a contact layer 9, an anode electrode 21, and a cathode electrode 22.

The semiconductor substrate 2 is a semiconductor substrate of a first conductivity type. In the embodiment, the first conductivity type is n type. For example, the semiconductor substrate 2 is an n-type InP substrate doped with Sn (tin). The lower cladding layer 3 is provided over the entire surface of the semiconductor substrate 2. The lower cladding layer 3 is a semiconductor layer of the first conductivity type. The lower cladding layer 3 is composed of a group III-V compound semiconductor, for example, Si-doped InP. The lower optical confinement layer 4 is provided on a region of the lower cladding layer 3. The lower optical confinement layer 4 is an undoped semiconductor layer and is composed of a group III-V compound semiconductor, for example, GaInAsP. The active layer 5 is provided on the lower optical confinement layer 4. The active layer 5 has, for example, a MQW (multi quantum well) structure or a SQW (single quantum well) structure. The active layer 5 is composed of a group III-V compound semiconductor, for example, GaInAsP or AlGaInAs. The diffraction grating layer 6 is provided on the active layer 5. The diffraction grating layer 6 is a semiconductor layer of p type which is a second conductivity type in the embodiment. The diffraction grating layer 6 is composed of a group III-V compound semiconductor, for example, Zn-doped GaInAsP. A diffraction grating (not shown in FIG. 1) having periodic projections and recesses is formed on the upper surface of the diffraction grating layer 6.

The lower optical confinement layer 4, the active layer 5, and the diffraction grating layer 6 constitute a stripe mesa structure 20 extending in a predetermined optical waveguide direction. The stripe mesa structure 20 has a pair of side surfaces 20a and 20b. The buried regions 7a and 7b are formed on the lower cladding layer 3 and the side surfaces 20a and 20b of the stripe mesa structure 20, thereby forming a current blocking structure. The buried region 7a includes a p-type InP layer 71 provided on the lower cladding layer 3 and an n-type InP layer 72 provided on the p-type InP layer 71. Similarly, the buried region 7b includes a p-type InP layer 73 provided on the lower cladding layer 3 and an n-type InP layer 74 provided on the p-type InP layer 73. The buried regions 7a and 7b are provided for concentrating a current in the stripe mesa structure 20 when the current is supplied to the DFB layer diode 1A.

The upper cladding layer 8 is provided on the stripe mesa structure 20 and the buried regions 7a and 7b. The upper cladding layer 8 is a semiconductor layer of p-type. The upper cladding layer 8 is composed of a group III-V compound semiconductor, for example, Zn-doped InP. The upper cladding layer 8 is composed of a semiconductor material having a smaller refractive index than that of the diffraction grating layer 6. The upper cladding layer 8 is formed to bury the periodic projections and recesses formed on the upper surface of the diffraction grating layer 6. That is, a diffraction grating structure is formed by the diffraction grating layer 6 having the projections and recesses and the upper cladding layer 8 formed over the projections and recesses.

The contact layer 9 is provided on the upper cladding layer 8. The contact layer 9 is a semiconductor layer of p-type. The contact layer 9 is composed of a group III-V compound semiconductor, for example, GaInAs doped with a high concentration of Zn. The anode electrode 21 is provided on the contact layer 9. The contact layer 9 makes an ohmic contact with the anode electrode 21. In addition, the cathode electrode 22 is provided on the back of the semiconductor substrate 2 so as to make an ohmic contact between the cathode electrode 22 and the semiconductor substrate 2.

Figure 2A:
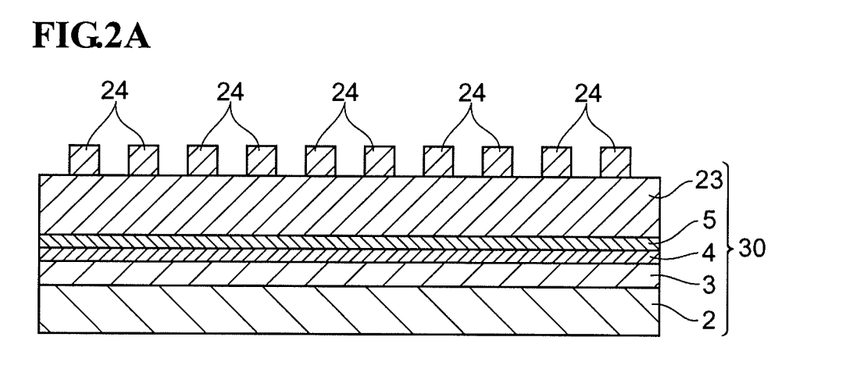
FIGS. 2A to 2C are drawings showing a method for manufacturing a DFB laser diode.
Figure 2B:
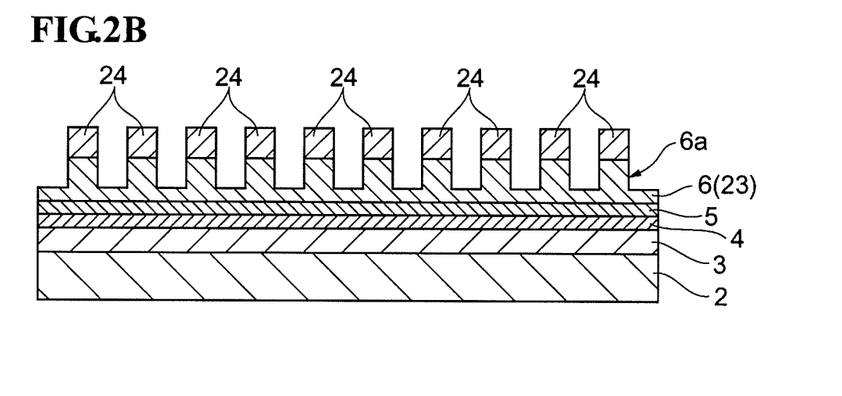
Figure 2C:
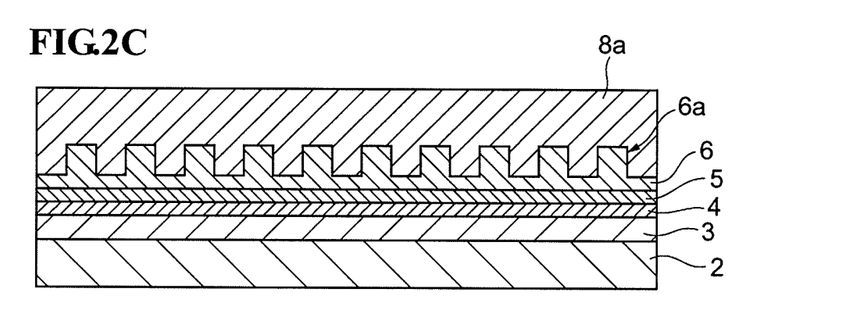

Here, a method for manufacturing the above-described DFB laser diode 1A is described. FIGS. 2A to 2C are drawings showing the method for manufacturing the DFB laser diode 1A. FIGS. 2A to 2C each show a side section (side section perpendicular to FIG. 1) along the optical waveguide direction.

First, as shown in FIG. 2A, the lower cladding layer 3, the lower optical confinement layer 4, the active layer 5, and the semiconductor layer 23 are formed in that order on the semiconductor substrate 2 by epitaxial growth (semiconductor layer growing step). The epitaxial growth can be performed by a metal-organic vapor phase epitaxy method (MOVPE). The semiconductor layer 23 is composed of a p-type semiconductor and is adapted for forming a diffraction grating. The semiconductor layer 23 is composed of a group III-V compound semiconductor, for example, Zn-doped GaInAsP. In description below, a product including the semiconductor substrate 2, the lower cladding layer 3, the lower optical confinement layer 4, the active layer 5, and the semiconductor layer 23 may be referred to as a "substrate product 30".

Next, an etching mask 24 having a diffraction grating pattern is formed on the semiconductor layer 23. In the embodiment, the etching mask 24 includes, for example, a insulating film of $SiO_2$. The etching mask 24 has a pattern having openings which are arranged at a predetermined period corresponding to recesses of the diffraction grating. For example, when the DFB laser diode 1A is used for optical fiber communications, the diffraction grating has a period corresponding to the emission wavelength (1.3 μM to 1.55 μm), for example, 200 nm to 240 nm.

Then, as shown in FIG. 2B, the semiconductor layer 23 is etched through the etching mask 24 to form the diffraction grating having periodic projections and recesses with a depth of about 20 to 50 nm (diffraction grating forming step). In this case, etching can be performed by, for example, a wet etching technique with an acid solution or a dry etching technique (reactive ion etching) with etching gas containing $C_4$ gas and $H_2$ gas. In this step, the diffraction grating layer 6 is formed, which has projections and recesses formed for the diffraction grating 6a on the upper surface thereof.

Then, the etching mask 24 is removed, and then, as shown in FIG. 2C, a semiconductor layer 8a (first upper cladding layer) which constitutes a portion of the upper cladding layer 8 is grown on the diffraction grating layer 6. In this case, the semiconductor layer 8a can be grown by, for example, a metal-organic vapor phase epitaxy method.

After this step, an etching mask to form the stripe mesa structure 20 is formed on the semiconductor layer 8a. The lower optical confinement layer 4, the active layer 5, and the diffraction grating layer 6 are partially removed by etching using the etching mask to form the stripe mesa structure 20. Then, by using the etching mask as a selective growth mask, the p-type InP layers 71 and 73 are grown on the lower cladding layer 3 and on both sides of the stripe mesa structure 20, and the n-type InP layers 72 and 74 are grown on the p-type InP layers 71 and 73, respectively. As a result, the buried regions 7a and 7b are formed. Then, the residual portion (second upper cladding layer) of the upper cladding layer 8 is grown on the stripe mesa structure 20 and the buried regions 7a and 7b, and then the contact layer 9 is grown thereon. Finally, the anode electrode 21 and the cathode electrode 22 are formed, completing the DFB laser diode 1A.

In general, the etching mask 24 shown in FIGS. 2A and 2B is formed by a two-beam interference exposure method or an electron beam lithography method. However, in this embodiment, the etching mask 24 is formed by an optical nano-imprint lithography method using a step-and-repeat method. It is difficult to form a diffraction grating including a phase shift structure when the diffraction grating is formed by conventional two-beam interference exposure method or an electron beam lithography method. On the other hand, a phase shift structure can be easily introduced, when the diffraction grating is formed by the nano-imprint lithography method. Further, process time required for forming the etching mask can be reduced. Hereinafter, the method for forming the etching mask 24 (i.e., the method for etching an insulating film) according to the embodiment is described.

FIGS. 3A to 3D and 4A to 4D are drawings for explaining the method for forming the etching mask 24 (the method for etching an insulating film) according to the embodiment.

Figure 3A:
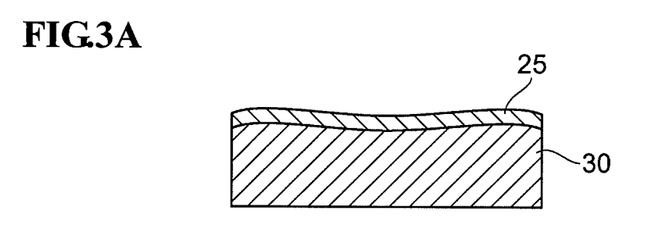
FIGS. 3A to 3D are drawings illustrating a method for forming an etching mask (method for etching an insulating film).

First, as shown in FIG. 3A, an insulating film 25 is formed on a substrate product (i.e., on the semiconductor layer 23 shown in FIG. 2A) by, for example, a plasma chemical vapor deposition (CVD) method (insulating film forming step). The thickness of the insulating film 25 is, for example, 20 nm to 50 nm. As a material for forming the insulating film 25, for example, silicon oxide ($SiO_2$), silicon nitride (SiN), or silicon oxynitride (SiON) can be used.

Figure 3B:
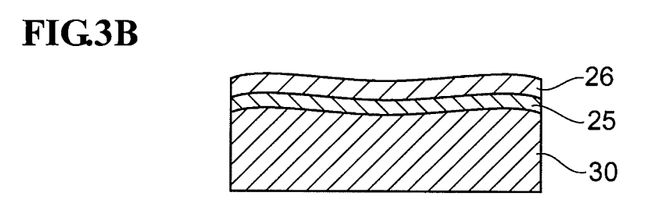

Next, as shown in FIG. 3B, an adhesive layer 26 is formed on the insulating film 25. The adhesive layer 26 is a layer for enhancing adhesion between the insulating film 25 and a first resin layer 27 described below. The adhesive layer 26 is formed by applying to the surface of the insulating film 15 using a spin coating method. The adhesive layer 26 is composed of, for example, a resin material, and, for example, a novolac resin can be used. The thickness of the adhesive layer 26 may be, for example, 50 nm or more and 80 nm or less.

Figure 3C:
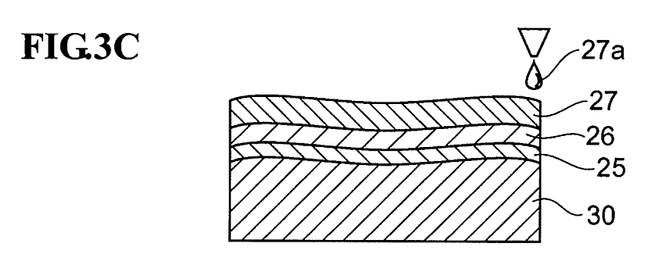

Then, as shown in FIG. 3C, the first resin layer 27 is formed on the adhesive layer 26. In this embodiment, the first resin layer 27 is composed of a resin (non-silicon-containing resin)

substantially not containing silicone. The first resin layer 27 is formed by, for example, a spin coating method of falling drops of a non-silicon-containing resin 27a on the surface of the adhesive layer 26. The non-silicon-containing resin 27a is made of, for example, a UV curing resin substantially not containing silicon, such as an acrylic UV curing resin. Here, when the silicon content in the first resin layer 27 is 0.1 atomic % or less, the first resin layer 27 can be regarded as not substantially containing silicon.

The thickness of the first resin layer 27 can be controlled to such a thickness that a flat surface is formed by burying the undulation (surface roughness) of the surface of the insulating film 25 which are produced due to the undulation (surface roughness) of the main surface of the semiconductor substrate 2. That is, the thickness of the first resin layer 27 is preferably more than the RMS (Root-Mean-Square) roughness of the surface of the insulating film 25. The RMS roughness of the surface of the insulating film 25 is generally substantially the same as the RMS roughness of the main surface of the semiconductor substrate 2, and is, for example, about 0.3 μm.

Figure 3D:
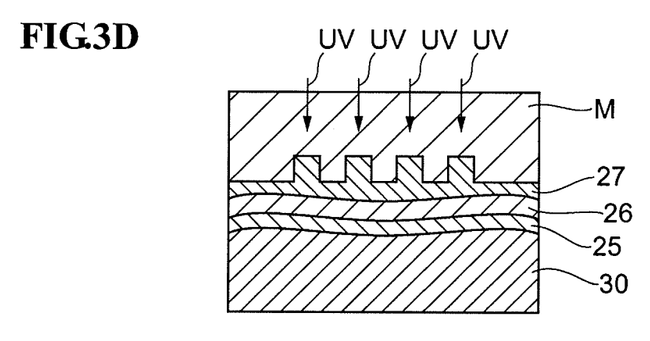

Next, the mold M having a predetermined pattern is prepared. In the embodiment, the pattern formed on the mold M has periodic projections and recesses corresponding to the pattern (line-and-space pattern) of the diffraction grating 6a shown in FIG. 2C. As shown in FIG. 3D, a mold M is pressed on the first resin layer 27. Consequently, the projections and recesses formed on the mold M are transferred to the first resin layer 27, forming the projections and recesses on the surface of the first resin layer 27 (imprint step). While the mold M is pressed on the first resin layer 27, ultraviolet light LTV is applied for curing the first resin layer 27. The ultraviolet light UV passes through the mold M and reaches the first resin layer 27. As a result, the first resin layer 27 is cured while maintaining the shape of the projections and recesses.

Figure 4A:
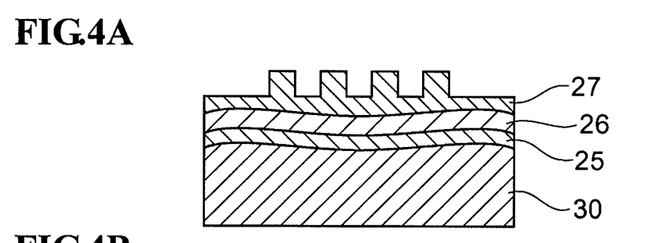
FIGS. 4A to 4D are drawings illustrating a method for forming an etching mask (method for etching an insulating film).
Figure 4B:
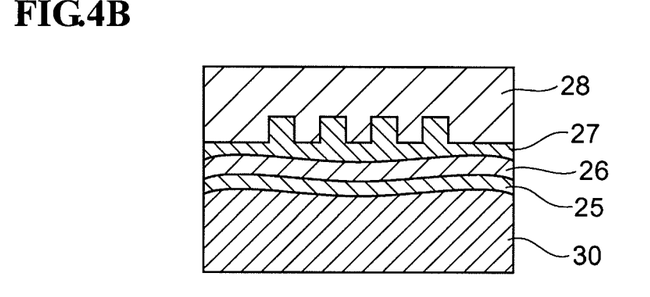

Then, as shown in FIG. 4A, the mold M is detached from the first resin layer 27. Then, as shown in FIG. 4B, a second resin layer 28 is formed on the first resin layer 27. In this step, the projections and recesses formed on the first resin layer 27 are completely covered with the second resin layer 28. The second resin layer 28 is composed of a silicon-containing resin. The silicon-containing resin is made of, for example, an organic silicon compound. In addition, the second resin layer 28 contains Si at, for example, a molar concentration ratio of 20%. The second resin layer 28 can be formed by, for example, a spin coating method on the first resin layer 27.

Figure 4C:
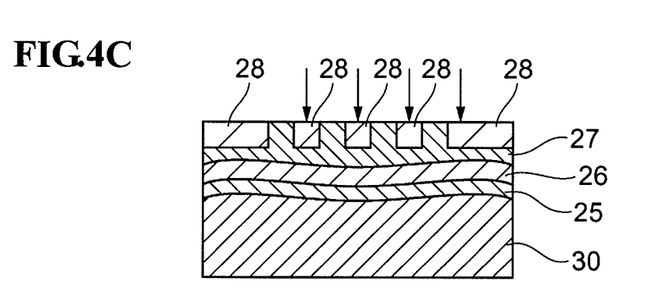

Then, as shown in FIG. 4C, the second resin layer 28 is etched until the surfaces of the projections formed in the first resin layer 27 are exposed (etch-back step). Therefore, the second resin layer 28 remains only in the recesses of the first resin layer 27.

In the etch-back step, the second resin layer 28 is etched by reactive ion etching (ME) with etching gas containing a mixture of $CF_4$ gas and $O_2$ gas. Here, an example of the reactive ion etching apparatus used in the etch-back step and an etching step by a reactive ion etching method described below is described.

Figure 5:
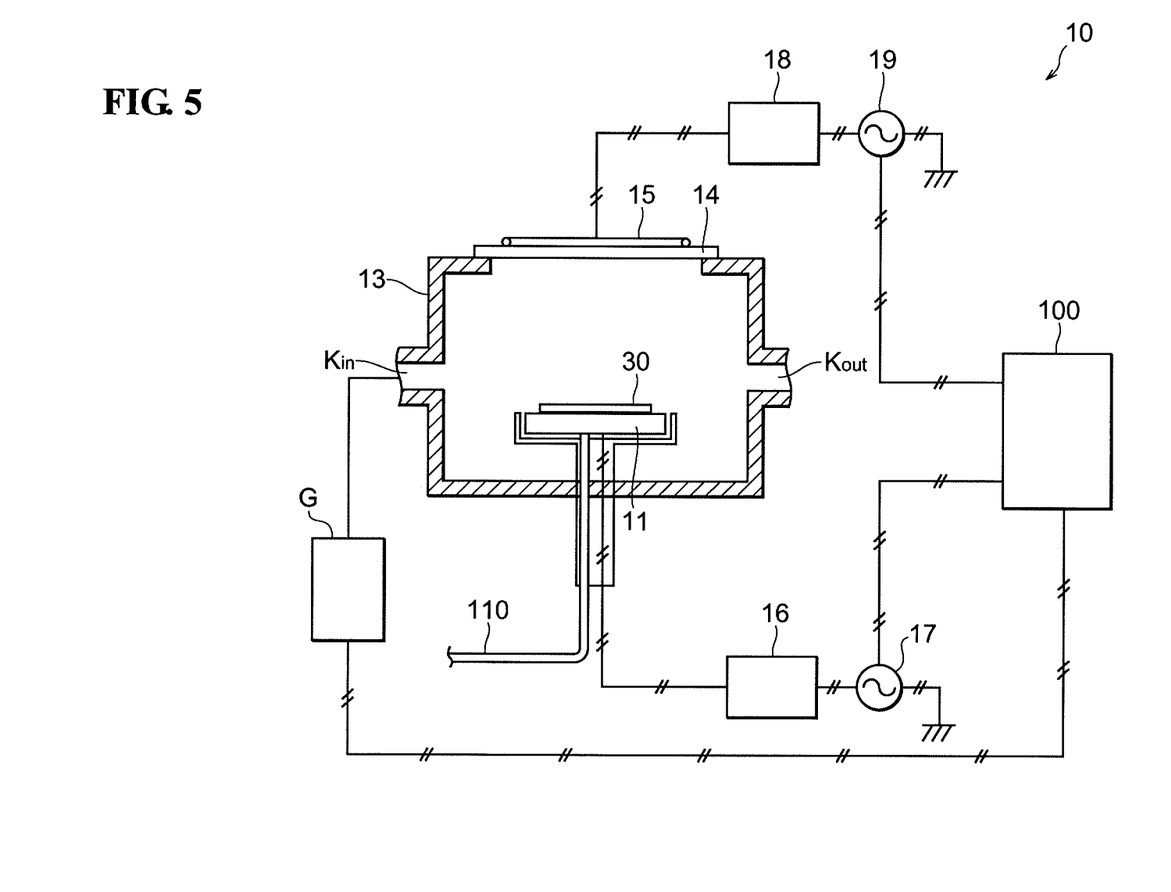
FIG. 5 is a configuration diagram (including a sectional view of a portion) schematically showing an etching apparatus used in the embodiment of the present invention.

FIG. 5 is a configuration diagram (including a sectional view of a portion) schematically showing an etching apparatus used in the embodiment. An etching apparatus 10 shown in FIG. 5 includes a vacuum chamber 13 provided for generating inductively coupled plasma (ICP) therein. In addition, a susceptor 11 is provided in the vacuum chamber 13 so that a wafer 30 is placed thereon. The vacuum chamber 13 also includes a gas inlet $K_{in}$, a gas outlet $K_{out}$, and a high-frequency introduction window 14.

The gas inlet $K_{in}$ is an opening for introducing the etching gas containing $CF_4$ gas and $O_2$ gas into the vacuum chamber 13. A gas feed system G (gas supply portion) including a supply source of each of the gases and a mass flow controller (MFC) connected to the supply source is connected to the gas inlet $K_{in}$. The gas outlet $K_{out}$ is an opening for exhausting the gas from the vacuum chamber 13. An exhaust system (not shown) including a vacuum pump and an exhaust control valve that controls an exhaust conductance is connected to the gas outlet $K_{out}$.

Further, the susceptor 11 includes a built-in heater (not shown). A coolant circulating pipe 110 is connected to the susceptor 11. Therefore, the susceptor 11 is heated to a predetermined desired temperature and kept at the temperature or cooled to a predetermined desired temperature and kept at the temperature. In addition, a high-frequency power supply 17 (bias output power supply) is connected to the susceptor 11 through an impedance matching box (matching network) 16 in order to apply bias high-frequency power to the susceptor 11. A high-frequency electromagnetic field generated by an induction coil 15 (high-frequency induction coil) which is installed outside the vacuum chamber 13 is introduced into the vacuum chamber 13 through the high-frequency introduction window 14 provided in an upper portion of the vacuum chamber 13. In addition, a high-frequency power supply 19 (ICP output power supply) is connected to the induction coil 15 through an impedance matching box 18 in order to apply high-frequency power to the induction coil 15. The high-frequency power supplies 17 and 19 are grounded at the same predetermined potential.

Further, a control system 100 (control portion) is connected to the MFC of the gas feed system G and the high-frequency power supplies 17 and 19. The control system 100 is adapted for independently controlling the valve opening of a flow regulating valve of each MFC and the outputs of the high-frequency power supplies 17 and 19. Therefore, each of the operation conditions is previously input or stored or appropriately input by an input unit (not shown).

When the wafer 30 placed on the susceptor 11 is etched, a self-bias voltage (minus voltage on the susceptor 11 side) is applied to the susceptor 11, and at the same time, a gas used as a component of the etching gas is supplied to the vacuum chamber 13 with the ICP voltage applied to the induction coil 15. The etching gas is put into a plasma state by applying the ICP voltage to the vacuum chamber 13. In addition, a bias high-frequency power is applied to the susceptor 11 from the high-frequency power supply 17 to generate the self-bias voltage. Ions in the thus-produced plasma gas are accelerated by a DC bias electric field produced by the self-bias voltage in the vacuum chamber 13 and collide with the surface of the wafer 30, thereby physically etching the wafer 30. Further, active radicals in the plasma gas are diffused and reach the surface of the wafer 30, thereby chemically etching the wafer 30.

In the embodiment, the second resin layer 28 is etched back with the etching apparatus 10 described above. In the etch-back step, the entire surface of the second resin layer 28 is uniformly etched. The self-bias voltage is generally set to a lower value or no self-bias voltage is applied, in order to perform isotropic etching by the chemical etching action. However, in the embodiment, in order to flatten the surface of the second resin layer 28, the self-bias voltage is set to a predetermined value (for example, 130 V) or more.

In the etch-back step, the gas flow rate ratio ($FL_{CF4}/FL_{O2}$) of the flow rate $FL_{CF4}$ of the $CF_4$ gas to the flow rate $FL_{O2}$ of the oxygen gas, which are used as the etching gas, is preferably 5 or more and 10 or less. When the gas flow rate ratio ($FL_{CF4}/FL_{O2}$) is 5 or more, oxidation of Si contained in the second resin layer 28 can be suppressed, and thus surface roughening of the second resin layer 28 can be suppressed. In addition, when the gas flow rate ratio ($FL_{CF4}/FL_{O2}$) is 10 or less, excessive deposition of $SiF_4$ at the bottoms of the etched grooves formed in the first resin layer 27 can be suppressed. As a result, etching of the first resin layer 27 can be suppressed from being inhibited by $SiF_4$.

Figure 4D:
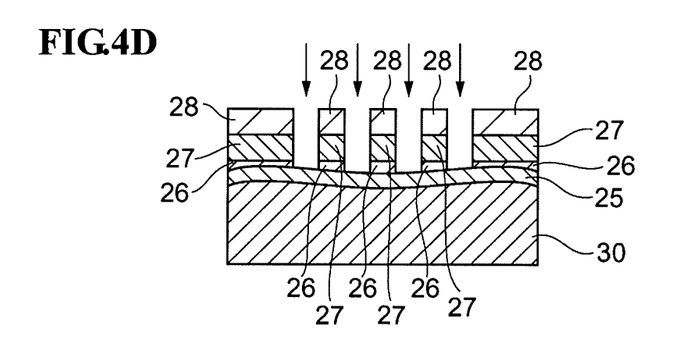

Then, as shown in FIG. 4D, the first resin layer 27 is selectively etched using as an etching mask the second resin layer 28 formed in the recesses of the first resin layer 27 to expose the surface of the insulating film 25 (break-through etch step). In the embodiment, the first resin layer 27 can be selectively etched by using $O_2$ gas as the etching gas because the second resin layer 28 contains Si and the first resin layer 27 does not contain Si. Further, in the embodiment, since the adhesive layer 26 is provided between the first resin layer 27 and the insulating film 25, the adhesive layer 26 as well as the first resin layer 27 is etched. Therefore, projections and recesses including the first resin layer 27 and the second resin layer 28 are formed on the insulating film 25. The projections and recesses have a reverse pattern of the projections and recesses formed on the mold M. In this way, a resin layer mask having a periodic structure pattern corresponding to the periodic structure of the diffraction grating 6a is formed.

Next, the insulating film 25 is etched using the resin layer mask including the first resin layer 27 and the second resin layer 28, thereby forming the pattern of the diffraction grating 6a in the insulating film 25 (pattern forming step). This etching is performed by, for example, a reactive ion etching method. In this case, etching gas containing $CF_4$ gas and $O_2$ gas is preferably used. After etching of the insulating film 25, the second resin layer 28 may be left or completely etched.

The etching mask 24 shown in FIG. 2A is formed through the above-described steps.

The operations and advantages of the method for manufacturing the DFB laser diode 1A and the method for etching an insulating film according to the embodiment of the present invention are described together with the problem of a conventional method. FIGS. 6A, 6B, 7, and 8 are drawings for explaining the problem of the NIL technique using two resin layers.

In the etch-back step described above in the method for etching an insulating film, the silicon-containing resin is etched with, for example, the etching gas containing $CF_4$ gas and $O_2$ gas. In this case, the carbon component of the silicon-containing resin is removed by vaporization as carbon dioxide according to the reaction of $C+O_2 \rightarrow CO_2$. In addition, the silicon component is once oxidized by the reaction of $Si+O_2 \rightarrow SiO_2$, and then vaporized and removed by the reaction of $SiO_2+CF_4 \rightarrow SiF_4+CO_2$. However, in the etch-back step, the Si component in the silicon-containing resin partially remains without being oxidized, and the remaining Si product inhibits etching of the silicon-containing resin. As a result, the silicon-containing resin layer after etch-back has nonuniformity in the surface height.

Figure 6A:
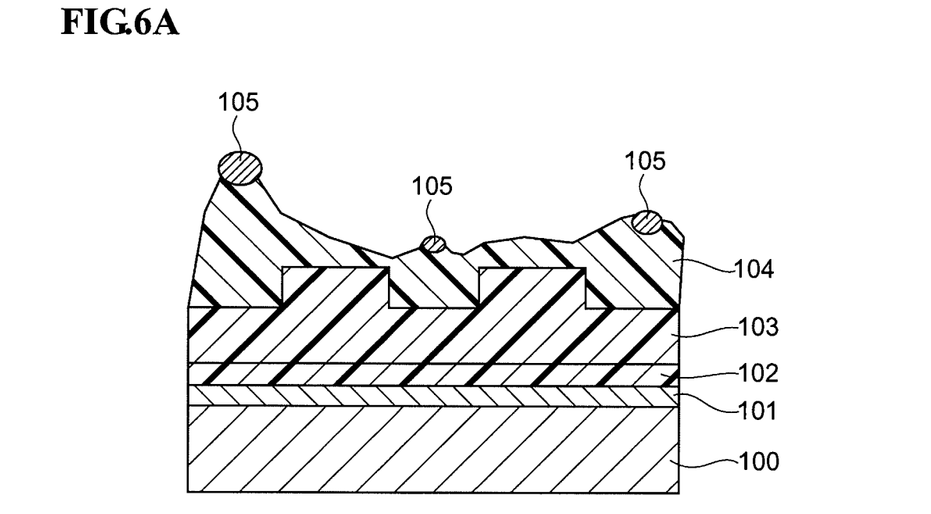
FIGS. 6A and 6B are drawings illustrating the problem of a NIL technique using two resin layers.
Figure 6B:
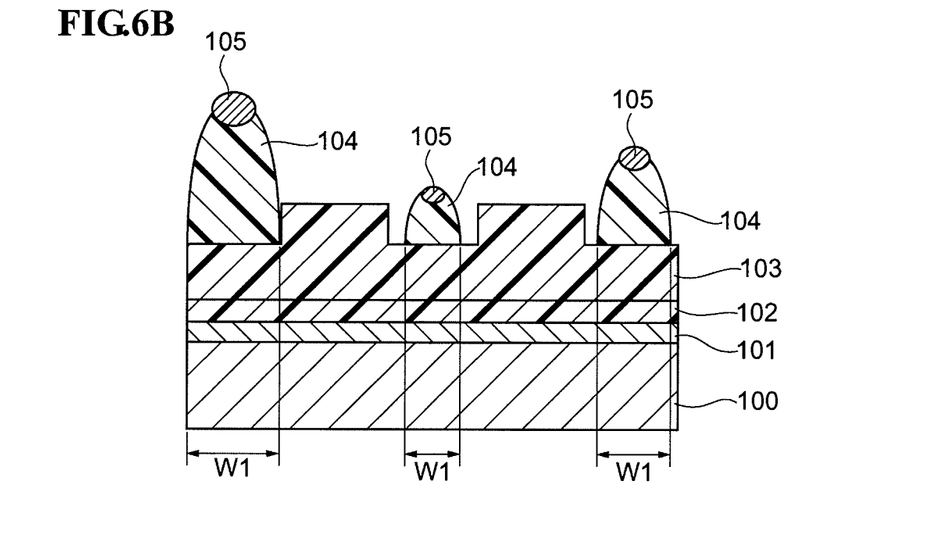

FIGS. 6A and 6B are drawings for explaining the problem due to the remaining Si product in the etch-back step. FIG. 6A shows a state during the etch-back step, and FIG. 6B shows a state after the completion of the etch-back step. FIGS. 6A and 6B each show a semiconductor substrate product 100 (corresponding to the substrate product 30 of the embodiment), a insulating film 101 (corresponding to the insulating film 25), an adhesive layer 102 (corresponding to the adhesive layer 26), a non-silicon-containing resin layer 103 (corresponding to the first resin layer 27), and a silicon-containing resin layer 104 (corresponding to the second resin layer 28).

Figure 7:
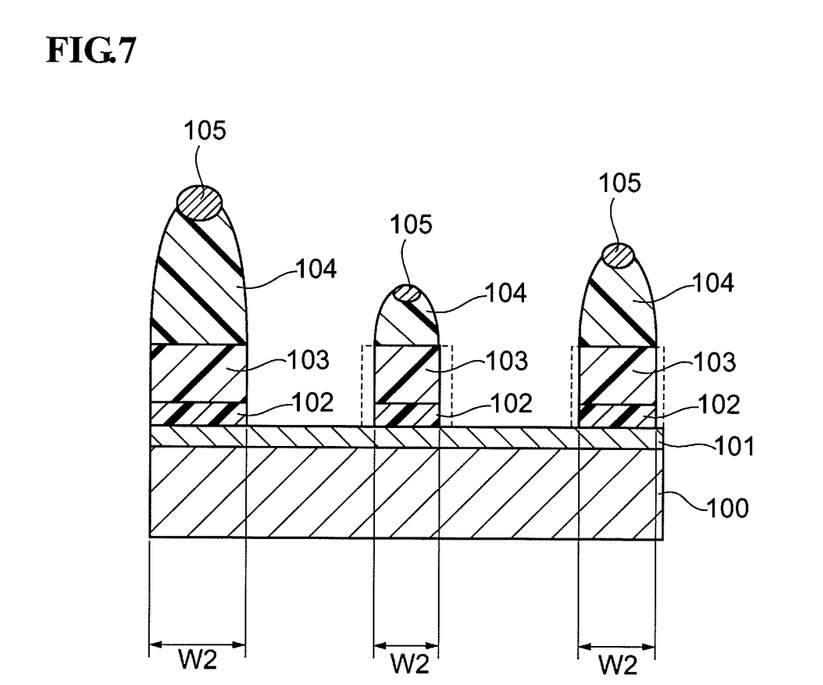
FIG. 7 is a drawing illustrating the problem of a NIL technique using two resin layers.

As shown in FIG. 6A, many nuclei 105 are produced by the Si product remaining without being oxidized on the surface of the silicon-containing resin layer 104 as the etch back process of the silicon-containing resin layer 104 proceeds. The nuclei 105 composed of the remaining Si product inhibit etching of the silicon-containing resin layer 104. Consequently, as shown in FIG. 6B, width W1 of the silicon-containing resin layer 104 varies after the etch-back step. Then, the non-silicon-containing resin layer 103 is selectively etched using the silicon-containing resin layer 104 as a mask (break-through etch step). In this step, as shown in FIG. 7, width W2 of the non-silicon-containing resin layer 103 and the adhesive layer 102 also varies according to the width W1 of the silicon-containing resin layer 104. As a result, the NIL technique using the two resin layers has difficulty in precisely forming a periodic structure pattern for a diffraction grating in the two resin layers. In FIG. 7, an original periodic structure pattern for a diffraction grating is shown by broken lines.

Figure 8:
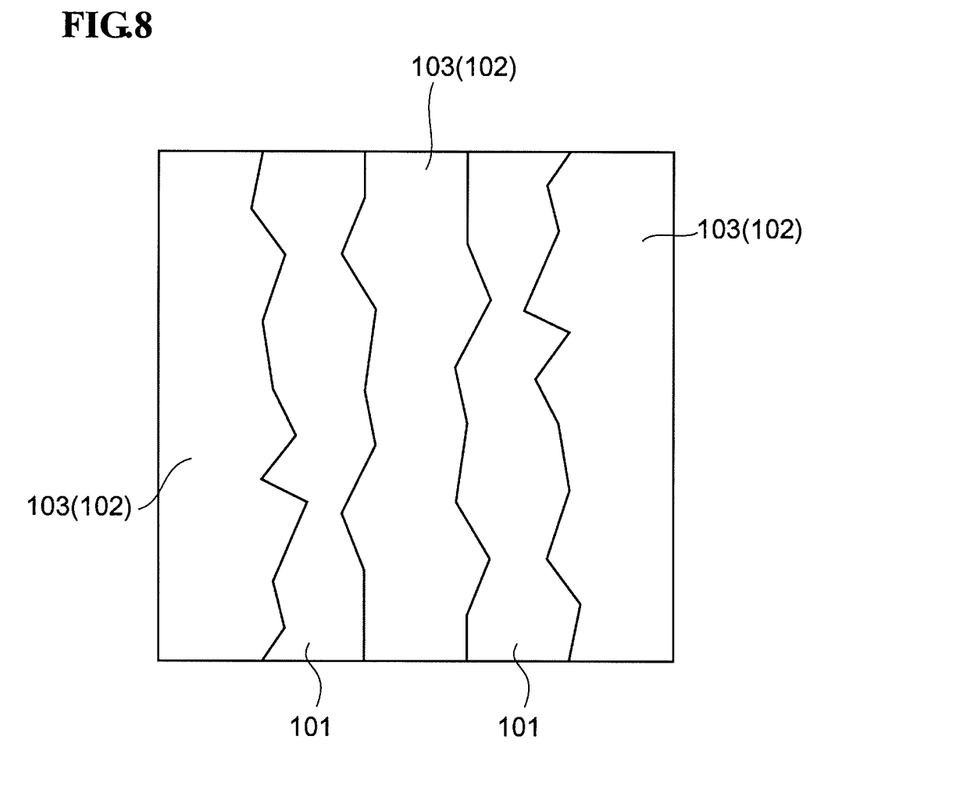
FIG. 8 is a drawing illustrating the problem of a NIL technique using two resin layers.

FIG. 8 is a drawing schematically showing an example of a planar shape of the non-silicon-containing resin layer 103 and the adhesive layer 102 shown in FIG. 7. As shown in FIG. 8, the degradation of the pattern shape (line edge roughness) of the periodic structure pattern occurs according to the variation in the width of the non-silicon-containing resin layer 103 and the adhesive layer 102. In FIG. 8, the line edge roughness is estimated to be about 60 nm. As a result, in the planar shape, the line width of the projections and recesses varies by about tens nanometers. The period of a diffraction grating provided for a DFB laser diode is, for example, about 200 nm to 240 nm. The oscillation wavelength of the DFB laser diode is determined by the period of the diffraction grating, thereby making it necessary to uniformly form the diffraction grating with high precision. Specifically, it is necessary that the variation in the period of the diffraction grating is 1% or less (several nanometers) of the period of the diffraction grating. The variation in the period of the diffraction grating causes a degradation of lasing characteristics such as variation in the oscillation wavelength or oscillation at a plurality of wavelengths. It is difficult to obtain the stable single mode oscillation characteristics for the DFB laser diode which has an undesirable diffraction grating with a non-uniform width and period. When the diffraction grating pattern is formed, it is necessary to control the period and line width of the pattern with a precision of several nanometers. Therefore, the variation of tens nanometers in the line width becomes a large problem in forming the diffraction grating pattern.

Examples of RIE conditions which cause the above problem are as follows. The unit of sccm (i.e., standard cubic centimeters per minute) represents the flow rate at 25° C. under 1 atm, and the conditions are converted based on 1 sccm=$1.69 \times 10^{-4}$ $Pa \cdot m^3 \cdot sec^{-1}$.

Figure 9:
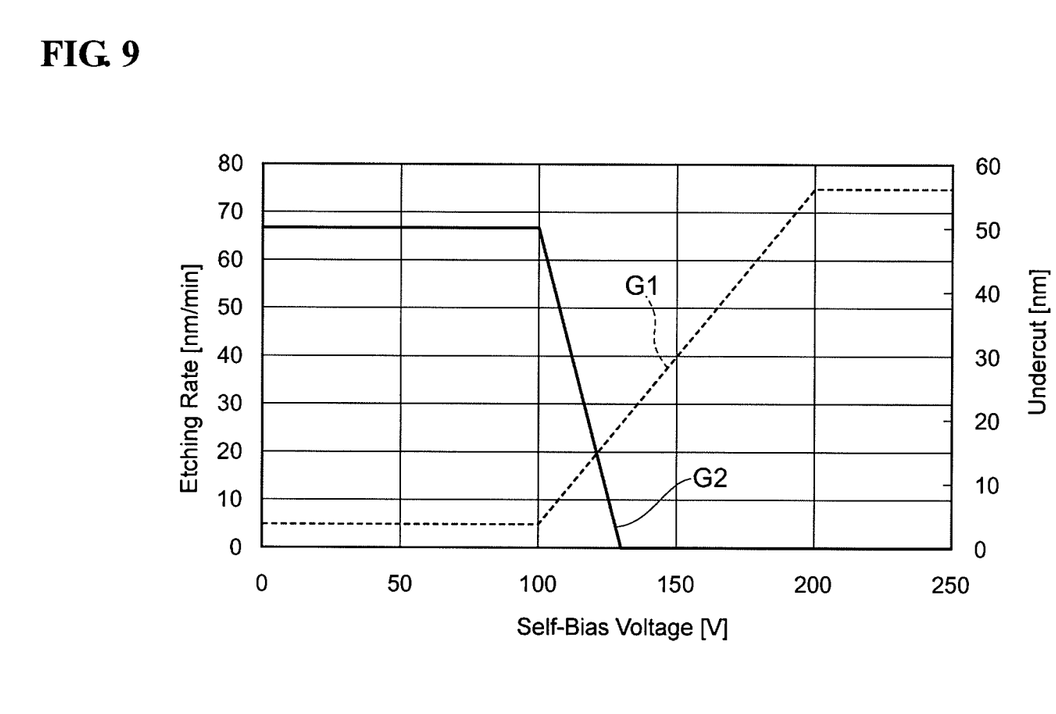
FIG. 9 is a graph showing relations of the self-bias voltage to the etching rate and undercut in an etch-back step.

ICP power: 150 W
Bias power: 10 W
$CF_4$ gas flow rate: 50 sccm
$O_2$ gas flow rate: 5 sccm
Process pressure: 4 Pa Next, a method for improving the line edge roughness of the periodic structure pattern and decreasing variation in the pattern width is described. FIG. 9 is a graph showing relations of the self-bias voltage to the etching rate and undercut in the etch-back step. In FIG. 9, the self-bias voltage is plotted as the absolute value of the self-bias voltage. The term "undercut" represents a variation in the line width of projections and recesses due to the Si product remaining without being oxidized when the silicon-containing resin layer is etched. When the variation in the line width of projections and recesses is small, the line edge roughness of the periodic structure pattern is also small. In FIG. 9, graph G1 shows a relation between the etching rate and the self-bias voltage, and graph G2 shows a relation between the under cut and the self-bias voltage (absolute value).

FIG. 9 indicates that the self-bias voltage of RIE is obviously correlated with the undercut, i.e., the variation in the line width of projections and recesses, in the etch-back step. Within a region where the self-bias voltage is smaller than 100 V, the etching rate of the silicon-containing resin layer is as low as about 5 nm per minute and does not depend on the self-bias voltage. This is considered to be due to the fact that as described above, the nuclei 105 are produced by the Si product in the silicon-containing resin during etching, thereby inhibiting etching of the silicon-containing resin. Also, the undercut is as large as about 50 nm at maximum by the inhibitory action.

On the other hand, when the self-bias voltage is 100 V or more, ions are drawn in the semiconductor substrate by a large electric field produced by the self-bias voltage. This enhances the action of physical etching (anisotropic etching or sputtering) of the silicon-containing resin. As a result, the nuclei 105 due to the Si product can be removed by collision with the ions. Therefore, when the self-bias voltage is 130 V or more, both the chemical etching (isotropic etching) action and the physical etching (anisotropic etching) action take place. Since the physical etching action increases as the self-bias voltage increases, the etching rate depends on the self-bias voltage (refer to the graph G1 in FIG. 9). In addition, since the nuclei 105 due to the Si product do not remain in the silicon-containing resin during etching, the silicon-containing resin after the etch-back step has a flat surface. Therefore, the undercut is close to 0 nm. In a region where the self-bias voltage exceeds 200 V, the silicon-containing resin is damaged by the physical etching action, and a modified layer which is difficult to etch is formed, thereby saturating the etching rate. Therefore, when the self-bias voltage of RIE in the etch-back step is 100 V or more, the undercut, i.e., the variation in the line width of projections and recesses, can be decreased. Consequently, the line edge roughness of the periodic structure pattern can be improved.

Figure 10A:
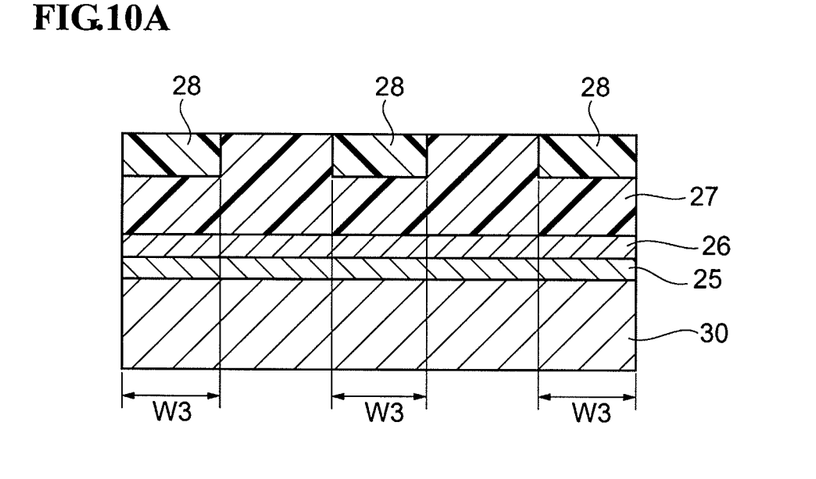
FIGS. 10A and 10B are drawings illustrating the advantage of the embodiment of the present invention.
Figure 10B:
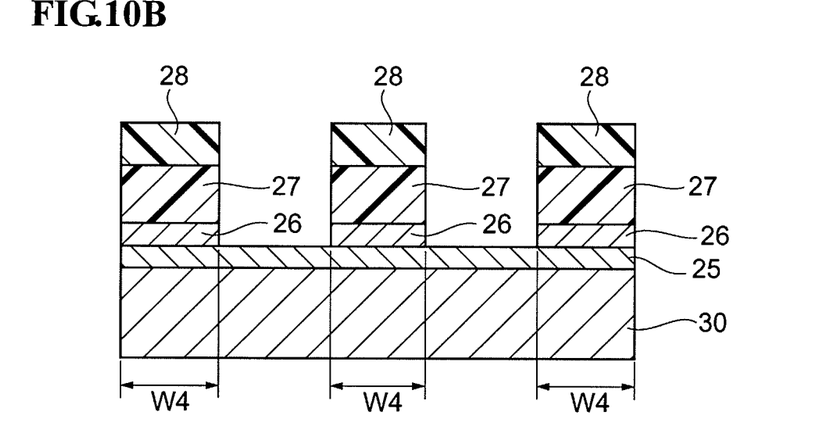

FIG. 10A shows the first and second resin layers 27 and 28 after the etch-back step in the embodiment. FIG. 10B shows the first and second resin layers 27 and 28 after the break-through etch step in the embodiment. In the embodiment, the absolute value of the self-bias voltage in RIE of the etch-back step is 130 V or more, and thus substantially no nuclei is produced due to the Si product during etching of the second resin layer 28. Therefore, as shown in FIG. 10A, the surface of the second resin layer 28 after the etch-back step is very flat, and the maximum height Rmax of surface roughness is, for example, 6 nm or less. This produces the uniform width W3 of the second resin layer 28.

Figure 11:
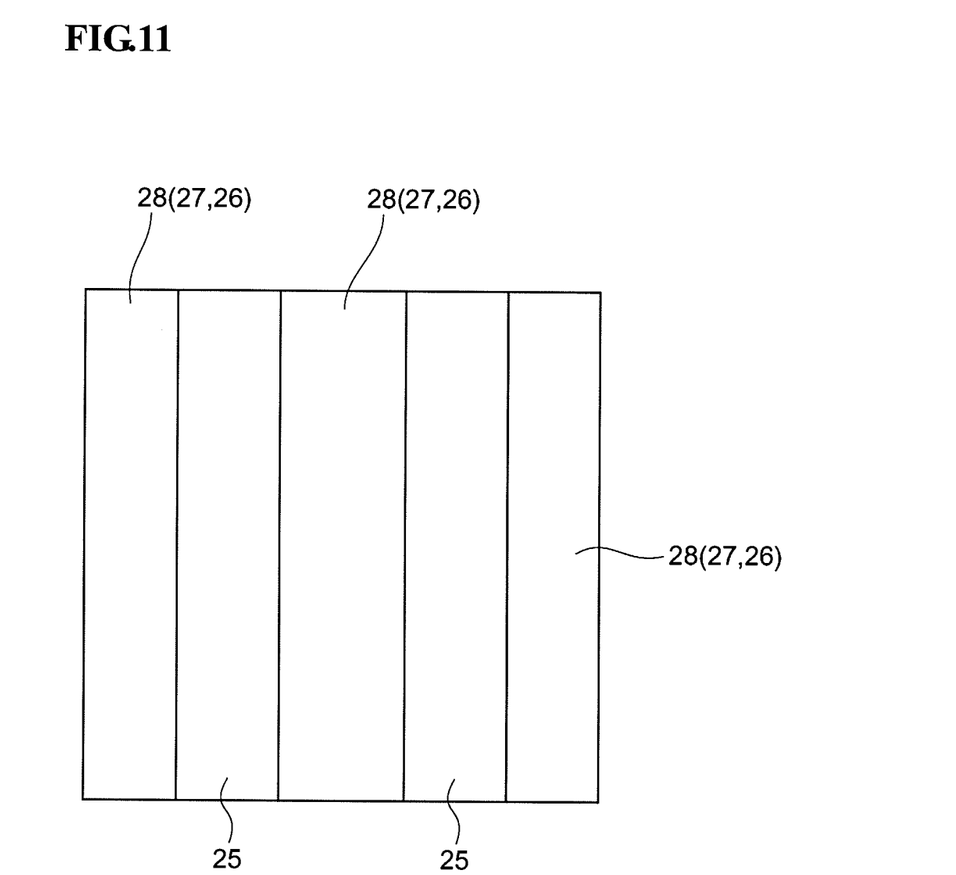
FIG. 11 is a drawing illustrating the advantage of the embodiment of the present invention.

In the subsequent break-through etch step, the first resin layer 27 is etched using the second resin layer 28 having flatness and the uniform width as a mask. Therefore, as shown in FIG. 10B, the resin layer mask including the first resin layer 27 and the adhesive layer 26 has a uniform width W4, and thus the periodic structure pattern for the diffraction grating 6a can be precisely formed. FIG. 11 is a drawing showing a planar shape of the resin layer mask including the second resin layer 28, the first resin layer 27, and the adhesive layer 26 shown in FIG. 10B. As shown in FIG. 11, the resin layer mask including the second resin layer 28, the first resin layer 27, and the adhesive layer 26 has a uniform width, thereby improving the line edge roughness of the periodic structure pattern. According to the embodiment, the line edge roughness of the resin layer mask including the first resin layer 27 after the break-through etch step can be decreased to, for example, 10 nm or less.

In order to obtain the self-bias voltage (absolute value) of 130 V or more, the ICP power is preferably 0 to 10 W. This is because when the ICP power is increased to 10 W or more, the self-bias voltage is decreased. In addition, in order to obtain the self-bias voltage (absolute value) is 130 V or more, the bias power is preferably 30 W or more. However, when the bias power is excessively increased, a semiconductor crystal may be damaged. Therefore, the upper limit of the bias power is preferably 50 W. The process pressure is preferably 4 Pa or more in order to increase the amount of ions drawn in the second resin layer 28. However, when the amount of ions drawn in the second resin layer 28 is excessively increased, a semiconductor crystal may be damaged. Therefore, the process pressure is preferably less than 10 Pa.

In addition, the etching gas used in the etch-back step preferably contains $CF_4$ gas and $O_2$ gas as in the embodiment. The resin component in the second resin layer 28 is not easily removed only by $CF_4$ gas, and thus surface roughness of the second resin layer 28 can be suppressed by further containing $O_2$ gas. Furthermore, when the ratio ($FL_{CF4}/FL_{O2}$) of the flow rate $FL_{CF4}$ of the $CF_4$ gas to the flow rate $FL_{O2}$ of the oxygen gas is 5 or more and 10 or less, the maximum height Rmax of surface roughness of the second resin layer 28 after the etch-back step can be further decreased.

The method for etching an insulating film and the method for manufacturing a semiconductor optical device are not limited to the above-described embodiment, and other various modifications can be made. For example, although the method for formation of a diffraction grating pattern of a DFB laser diode is described in the embodiment, application of the present invention is not limited to this. The present invention can be applied to manufacture of various semiconductor devices in which a pattern is formed by the NIL technique.

Although the ICP-RIE method is used in the etch-back step in the embodiment, other RIE methods may be used in the etch-back step of the present invention.

Although, in the embodiment, the self-bias voltage (absolute value) in the etch-back step is 130 V or more, the self-bias voltage may be lower than 130 V as long as the Si product produced by etching can be removed.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for etching an insulating film comprising the steps of:
   forming an insulating film;
   forming a first resin layer composed of a non-silicon-containing resin on the insulating film;
   forming a pattern including projections and recesses in the first resin layer;
   forming a second resin layer composed of a silicon-containing resin to cover the projections and the recesses of the pattern in the first resin layer;
   etching the second resin layer by reactive ion etching with etching gas containing $CF_4$ gas and oxygen gas until the projections of the first resin layer are exposed, a Si component of the second resin layer being oxidized in etching the second resin layer;

selectively etching the first resin layer until the insulating film is exposed using as a mask the second resin layer buried in the recesses of the first resin layer to form a resin layer mask; and etching the insulating film using the resin layer mask, wherein in the step of etching the second resin layer, the reactive ion etching is performed under applying a self-bias voltage so that a Si product is removed, the Si product being provided from the Si component remaining in the second resin layer without being oxidized.

2. The method for etching an insulating film according to claim 1, wherein the step of forming the pattern in the first resin layer further comprises the steps of:

preparing a mold having the pattern;

pressing the mold on the first resin layer, the pattern transferring to the first resin layer;

curing the first resin layer while pressing the mold on the first resin layer; and detaching the mold from the first resin layer.

3. The method for etching an insulating film according to claim 1, wherein the insulating film is composed of at least one of silicon oxide ($SiO_2$), silicon nitride (SiN), and silicon oxynitride (SiON).

4. The method for etching an insulating film according to claim 1, wherein the non-silicon-containing resin is composed of an acrylic UV curing resin, and the silicon-containing resin is composed of an organic silicon compound.

5. The method for etching an insulating film according to claim 1, wherein the reactive ion etching in the step of etching the second resin layer is performed by using an ICP-RIE apparatus provided with an ICP output power supply and a bias output power supply so that the self-bias voltage is adjusted by high-frequency electric power supplied from the bias output power supply.

6. The method for etching an insulating film according to claim 1, wherein in the step of etching the second resin layer, the self-bias voltage applied in the reactive ion etching for etching the second resin layer is 130 V or more.

7. The method for etching an insulating film according to claim 1, wherein in the step of etching the second resin layer, the ratio ($FL_{CF4}/FL_{O2}$) of the flow rate $FL_{CF4}$ of the $CF_4$ gas to the flow rate $FL_{O2}$ of the oxygen gas is 5 or more and 10 or less.

8. The method for etching an insulating film according to claim 1, wherein after the step of etching the second resin layer, the maximum height $R_{max}$ of surface roughness of the second resin layer is 6 nm or less.

9. The method for etching an insulating film according to claim 1, wherein after the step of selectively etching the first resin layer, the line edge roughness of the resin layer mask is 10 nm or less.

10. A method for manufacturing a semiconductor optical device including a diffraction grating, the method comprising the steps of:

growing a semiconductor layer;

forming an insulating film on the semiconductor layer;

forming a first resin layer composed of a non-silicon-containing resin on the insulating film;

forming a pattern including projections and recesses in the first resin layer;

forming a second resin layer composed of a silicon-containing resin to cover the projections and the recesses of the pattern in the first resin layer;

etching the second resin layer by reactive ion etching with etching gas containing $CF_4$ gas and oxygen gas until the projections of the first resin layer are exposed, a Si component of the second resin layer being oxidized in etching the second resin layer;

selectively etching the first resin layer until the insulating film is exposed using as a mask the second resin layer buried in the recesses of the first resin layer to form a resin layer mask;

etching the insulating film using the resin layer mask; and etching the semiconductor layer using the insulating film as a mask to form the diffraction grating, wherein in the step of etching the second resin layer, the reactive ion etching is performed under applying a self-bias voltage so that a Si product is removed, the Si product being provided from the Si component remaining in the second resin layer without being oxidized.

11. The method for manufacturing a semiconductor optical device according to claim 10, wherein in the step of etching the second resin layer, the self-bias voltage applied in the reactive ion etching for etching the second resin layer is 130 V or more.

* * * * *